(12) United States Patent
Subramani et al.

(10) Patent No.: US 8,637,410 B2
(45) Date of Patent: Jan. 28, 2014

(54) METHOD FOR METAL DEPOSITION USING HYDROGEN PLASMA

(75) Inventors: Anantha K. Subramani, San Jose, CA (US); John C. Forster, Mt. View, CA (US); Seshadri Ganguli, Sunnyvale, CA (US); Michael S. Jackson, Sunnyvale, CA (US); Xinliang Lu, Fremont, CA (US); Wei W. Wang, Santa Clara, CA (US); Xinyu Fu, Fremont, CA (US); Yu Lei, Foster City, CA (US)

(73) Assignee: Applied Materials, Inc., Santa Clara, CA (US)

(*) Notice: Subject to any disclaimer, the term of this patent is extended or adjusted under 35 U.S.C. 154(b) by 272 days.

(21) Appl. No.: 13/082,968

(22) Filed: Apr. 8, 2011

(65) Prior Publication Data

US 2012/0258602 A1 Oct. 11, 2012

(51) Int. Cl.
*H01L 21/31* (2006.01)
(52) U.S. Cl.
USPC .................................... 438/758; 257/E21.24
(58) Field of Classification Search
USPC ..................................... 438/758; 257/E21.24
See application file for complete search history.

(56) References Cited

U.S. PATENT DOCUMENTS

| | | | | |
|---|---|---|---|---|
| 7,435,454 B2* | 10/2008 | Brcka | ............................ | 427/569 |
| 7,691,742 B2 | 4/2010 | Marcadal et al. | | |
| 8,101,531 B1* | 1/2012 | Li et al. | ......................... | 438/788 |
| 2004/0142557 A1* | 7/2004 | Levy et al. | ..................... | 438/680 |
| 2005/0164487 A1 | 7/2005 | Seutter et al. | | |
| 2006/0094238 A1* | 5/2006 | Levy et al. | ..................... | 438/656 |
| 2008/0085611 A1 | 4/2008 | Khandelwal et al. | | |
| 2008/0102613 A1* | 5/2008 | Elers | ............................. | 438/584 |
| 2008/0146021 A1* | 6/2008 | Huang et al. | ................... | 438/626 |
| 2008/0223287 A1 | 9/2008 | Lavoie et al. | | |
| 2009/0278224 A1* | 11/2009 | Kim et al. | ....................... | 257/506 |
| 2011/0159673 A1* | 6/2011 | Hanawa et al. | ............... | 438/558 |
| 2012/0077349 A1* | 3/2012 | Li et al. | ......................... | 438/762 |

* cited by examiner

*Primary Examiner* — Alexander Ghyka
*Assistant Examiner* — Stanetta Isaac
(74) *Attorney, Agent, or Firm* — Servilla Whitney LLC

(57) ABSTRACT

Methods for formation and treatment of pure metal layers using CVD and ALD techniques are provided. In one or more embodiments, the method includes forming a metal precursor layer and treating the metal precursor layer to a hydrogen plasma to reduce the metal precursor layer to form a metal layer. In one or more embodiments, treating the metal precursor layer includes exposing the metal precursor layer to a high frequency-generated hydrogen plasma. Methods of preventing a hydrogen plasma from penetrating a metal precursor layer are also provided.

16 Claims, 8 Drawing Sheets

METHOD FOR METAL DEPOSITION USING HYDROGEN PLASMA

BACKGROUND

Embodiments of the present invention generally relate to methods for depositing pure metal. Specific embodiments of the invention are directed to methods for pure metal deposition using CVD or ALD techniques.

Hydrogen plasma is often utilized to enable pure metal deposition by using CVD or ALD techniques. Typically, a metal precursor is used as a metal source. As schematically shown in FIG. 1, hydrogen plasma is utilized to reduce the precursor or to treat a deposited film to improve film properties, such as purity, resistivity and/or grain structure and is deposited typically on a gate dielectric layer 110, typically comprising HfO, SiON and/or $SiO_2$, disposed on an active area or underlying Si layer 120.

Damage to the underlying layers is a concern in processes that include, but are not limited to, metal gate deposition, formation of a treatment film on a low K films, and silicide deposition. In metal gate deposition, the substrate may be Si and may include a thin oxide layer deposited on the Si substrate having a thickness of less than about 10 Å, a high K oxide disposed on the thin oxide layer having a thickness less than about 20 Å, an optional cap layer having a thickness in the range from about 10 Å to about 20 Å and a metal gate layer such as a tantalum or cobalt metal layer. In processes for providing a treatment film on a low K film, the substrate includes a low K material, a barrier layer deposited on the substrate followed by a metal deposition on the barrier layer or treatment of the barrier layer. The barrier layer in such processes is typically thin. In silicide deposition, the substrate typically includes Si and includes a metal silicide layer disposed thereon and cleaned and a barrier layer is disposed on the metal silicide layer.

There is a need to provide methods that utilize the benefits of hydrogen plasma in pure metal deposition but control or eliminate the damage that hydrogen plasma can cause.

SUMMARY OF THE INVENTION

A first aspect of the present invention pertains to a method of depositing a metal layer on a semiconductor substrate. In one or more embodiments, the method includes placing the substrate on a substrate support in a chamber of a reactor, depositing a metal precursor layer on the substrate and reducing the metal precursor layer to form a metal layer by exposing the metal precursor layer to a hydrogen plasma. In one or more variants, the hydrogen plasma comprises a precursor gas including hydrogen or a mixture of hydrogen and one or more of Ar, $NH_3$, $N_2$ and He. In one or more embodiments, reducing the metal precursor layer to form a metal layer includes exposing the metal precursor layer to a hydrogen plasma generated by alternating frequencies of about 13.56 MHz and about 40 MHz.

As used herein, the phrases "13.56 MHz frequency-generated plasma" and "40 MHz frequency-generated plasma" includes plasma that has been generated by a power or energy source having approximately or about the recited frequency.

In one or more embodiments, the steps of depositing a metal precursor layer on a substrate and reducing the metal precursor layer occur in repeated cycles until the desired thickness of the metal layer are formed. In such embodiments the deposited metal precursor layers are reduced after deposition by exposing the deposited metal precursor layer to about 40 MHz frequency-generated hydrogen plasma occurs until a metal layer having a thickness in the range from about 0.2 Å to about 3 Å is formed. After formation of a metal layer having a thickness in the range from about 0.2 Å to about 3 Å, subsequently deposited metal precursor layers are reduced after deposition by exposing the deposited metal precursor layer to about 13.56 MHz frequency-generated hydrogen plasma occurs until a metal layer having a thickness in the range from about 2 Å to about 70 Å is formed.

Alternatively, the method may include depositing a metal precursor on a substrate until the desired thickness of the metal precursor layer is formed and the metal precursor is reduced to form the metal layer in a single cycle. In such embodiments, the thickness of the metal precursor layer may be in the range from about 2 Å to about 70 Å.

In one or more embodiments, the step of exposing the metal precursor layer to a hydrogen plasma generated by alternating frequencies of about 13.56 MHz and about 40 MHz may include introducing a hydrogen gas into the chamber, supplying power to a power source operating at frequency of about 13.56 MHz to generate a hydrogen plasma within the chamber for a first cycle, and supplying power to a power source operating at a frequency of about 40 MHz to generate a hydrogen plasma within the chamber for a second cycle. In one variant, the power supplied to the power source operating at a frequency of about 13.56 MHz is in the range from about 200 W to about 2000 W and the power supplied to the power source operating at a frequency of about 40 MHz is in the range from about 200 W to about 2000 W.

The metal layer deposited on the substrate may include a metal gate layer. In such embodiments, exposing the metal precursor layer to a hydrogen plasma generated by alternating frequencies of about 13.56 MHz and about 40 MHz prevents the hydrogen plasma from penetrating the metal precursor layer and damaging the substrate. In one or more optional embodiments, the substrate may include a low K material and the step of exposing the metal precursor layer to a hydrogen plasma generated by alternating frequencies of about 13.56 MHz and about 40 MHz prevents the hydrogen plasma from penetrating the metal precursor layer and degrading the low K material. In another variant, the substrate may include silicon and a metal silicide layer disposed on the silicon that forms or creates a silicon/silicide layer interface. In such embodiments, the step of exposing the metal precursor layer to a hydrogen plasma generated by alternating frequencies of about 13.56 MHz and about 40 MHz prevents the hydrogen plasma from penetrating the metal precursor layer and damaging the silicon/silicide layer interface.

A second aspect of the present invention pertains to a method of depositing a metal layer on a semiconductor substrate that includes placing the substrate on a substrate support in a chamber of a reactor, depositing a metal precursor layer on the substrate and reducing the metal precursor layer to form a metal layer by exposing the metal precursor layer to about 40 MHz frequency-generated hydrogen plasma. In one or more embodiments, the hydrogen plasma comprises a precursor gas including hydrogen or a mixture of hydrogen and one or more of Ar, $NH_3$, $N_2$ and He.

In one or more embodiments, the exposing the metal precursor layer to a hydrogen plasma generated by a frequency of 40 MHz includes introducing a hydrogen gas into the chamber and supplying power to a power source operating at a frequency of 40 MHz to generate a hydrogen plasma within the chamber. The power supplied to the power source operating at a frequency of about 40 MHz may be in the range from about 200 W to about 2000 W.

Embodiments of the second aspect of the present invention may further include removing the substrate from the chamber after deposition of the metal precursor layer and reduction of the metal precursor layer, introducing a second hydrogen gas into the chamber and supplying power to a power source operating at a frequency of 13.56 MHz to generate a second hydrogen plasma within the chamber.

In one or more embodiments of the second aspect of the present invention, the metal layer deposited on the substrate includes a metal gate layer and exposing the metal precursor layer to about 40 MHz frequency-generated hydrogen plasma prevents the hydrogen plasma from penetrating the metal precursor layer and damaging the substrate. In another variant, the substrate comprises a low K material and exposing the metal precursor layer to about 40 MHz frequency-generated hydrogen plasma prevents the hydrogen plasma from penetrating the metal precursor layer and degrading the low K material. In yet another variant, the substrate comprises silicon and a metal silicide layer disposed on the silicon creating a silicon/silicide layer interface and exposing the metal precursor layer to about 40 MHz frequency-generated hydrogen prevents the hydrogen plasma from penetrating the metal precursor layer and damaging the silicon/silicide layer interface.

A third aspect of the present invention pertains to a method depositing a metal layer on a semiconductor substrate including placing the substrate on a substrate support in a chamber of a reactor, depositing a metal precursor layer on the substrate and reducing the metal precursor layer to form a metal layer by exposing the metal precursor layer to a dual frequency-generated hydrogen plasma to improve step coverage of the metal layer. In one or more embodiments, the hydrogen plasma comprises a precursor gas including hydrogen or a mixture of hydrogen and one or more of Ar, $NH_3$, $N_2$ and He. In one or more variants, exposing the metal precursor layer to a dual frequency-generated hydrogen plasma may include exposing the metal precursor layer to about 40 MHz frequency generated plasma. In one or more specific embodiments, exposing the metal precursor layer to a dual frequency-generated hydrogen plasma includes introducing a hydrogen gas into the chamber, supplying power to a power source operating at a frequency of about 13.56 MHz to generate a first hydrogen plasma within the chamber and simultaneously supplying power to a power source operating at a frequency of about 40 MHz to generate a second hydrogen plasma within the chamber.

As used herein, the terms "treatment," "treat" or "treating" a layer or substrate shall refer to exposure of that layer or substrate to a hydrogen plasma as otherwise described herein. Such exposure may be cyclical or may be in short durations that may be repeated. The duration of exposure may be constant or may vary from each exposure to the next. Other conditions during exposure may also vary or may be constant.

The foregoing has outlined rather broadly certain features and technical advantages of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention pertain to methods of depositing a metal layer on a semiconductor substrate. More specifically, embodiments described herein pertain to deposition of metal precursor layers and treatment of those layers with a hydrogen plasma to provide a pure metal layer or a metal layer with reduced impurities and/or organic components. More particular embodiments include selectively vary the ion energy of the incoming hydrogen species, e.g. hydrogen radicals, used in hydrogen plasma treatment.

If hydrogen plasma treatment is utilized in metal gate deposition processes described in the background, it has been found that the hydrogen ions are able penetrate through the oxide layers and attach the underlying Si substrate. Similarly, hydrogen ions from a hydrogen plasma treatment process used in processes for the formation of a treatment film on low K films are able to penetrate through the barrier layer and attach the low K material thereby degrading it and increasing its K value. Also, during silicide deposition as described above in the background, if a thin barrier layer is utilized and a hydrogen plasma treatment is utilized, it has been found that the hydrogen ions are capable of penetrating the barrier layer and attacking the Si/silicide layer interface.

Figure 1:
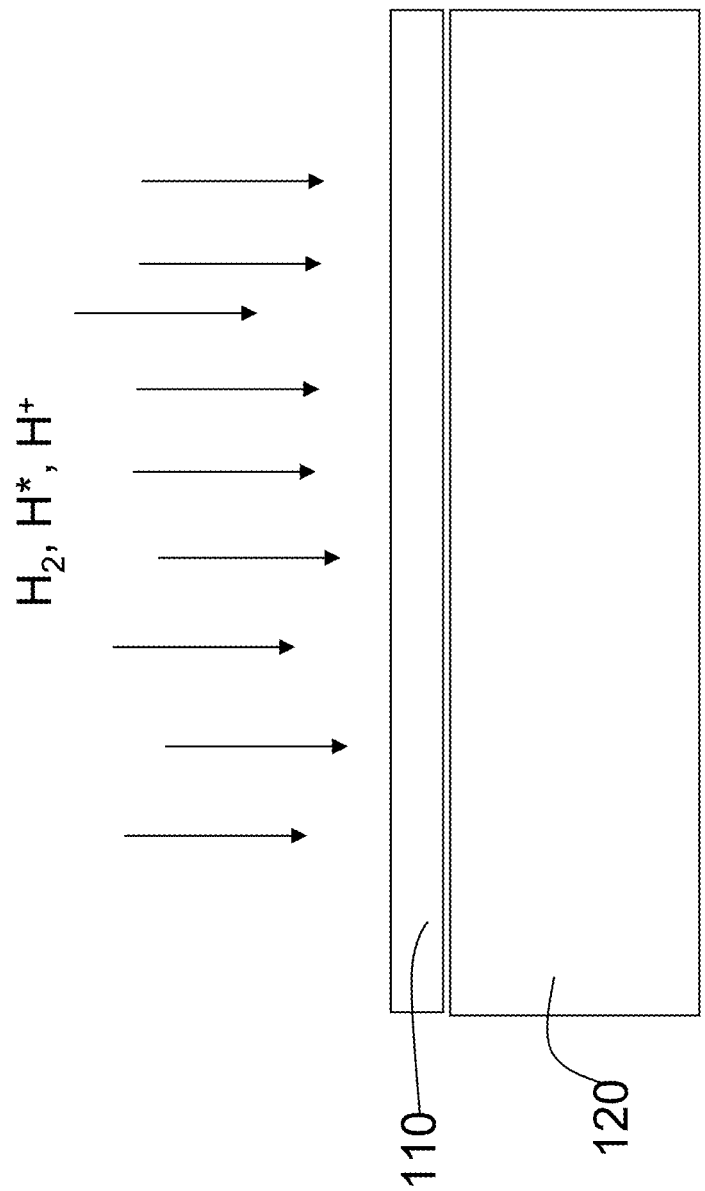
FIG. 1 is a partial schematic of a semiconductor device undergoing hydrogen plasma treatment.
Figure 2A:
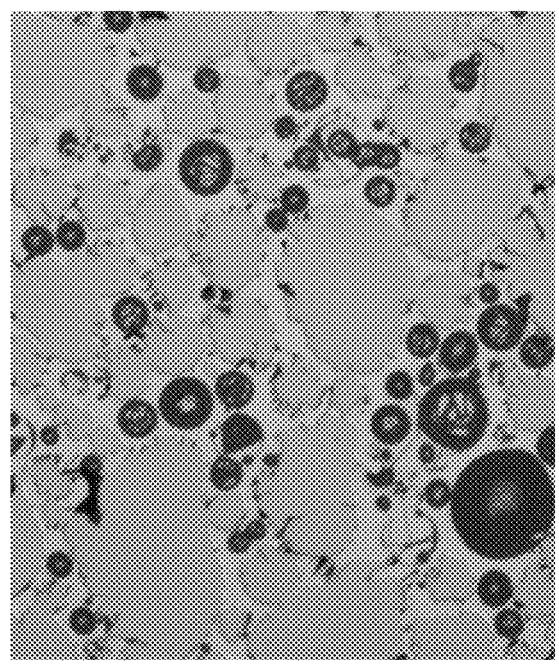
FIG. 2A is a microscope image of a partial cross-section view of a semiconductor device after hydrogen plasma treatment according to the prior art.
Figure 2B:
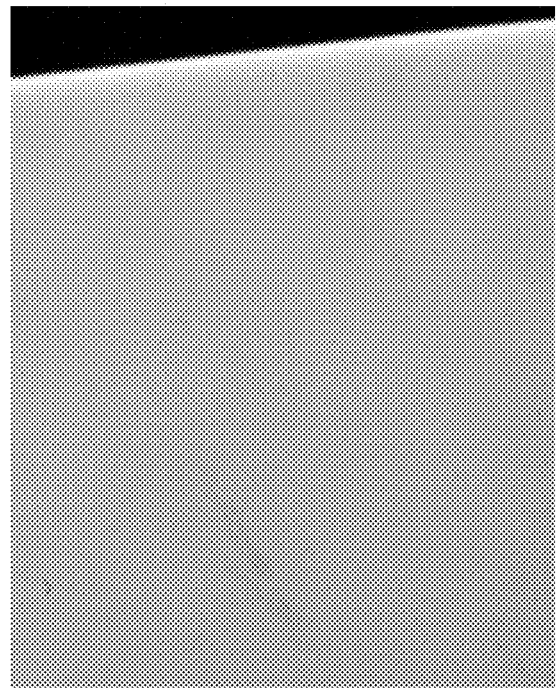
FIG. 2B is a microscope image illustrating a partial cross-section view of a semiconductor device after hydrogen treatment according to one or more embodiments of the present invention.

It has been surprisingly discovered that there is a competitive reaction between the reduction of the adsorbed species and damage to the underlying and partially processed device wafer. More specifically, it was found that hydrogen plasma damages the underlying Si layer 120 by creating bubbles in the deposited film, as shown in the gate dielectric layer 110 and Si layer 120 interface illustrated in FIG. 2A. FIG. 2B illustrates an image of a cross section of a gate dielectric and Si layer interface showing no damage. The existence of such damage was surprising because it was understood that hydrogen radicals found in hydrogen plasma are very light weight and would not be able to cause the type of damage that was occurring.

Variation in the ion energy of the incoming hydrogen species may be accomplished by varying the type of plasma (e.g., inductively-coupled plasma or capacitively coupled plasma) and/the frequency at which the plasma is generated. In applications that utilize capacitively coupled plasma, the hydrogen species typically has higher ion energy. When the higher energy hydrogen species in capacitively coupled plasma are utilized to treat a substrate, it has been found that the impact of the high energy hydrogen species on the surface of the substrate cause damage to the surface. Accordingly, methods described herein generally vary the ion energy by varying the frequency at which the plasma is generated. Recipe parameters such as pressure, flow and power can also be used to vary the energy of the incoming hydrogen species to tune selectivity between the ability of the hydrogen species to reduce the adsorbed metal precursor and cause damage to the underlying partially processed device wafer.

One or more embodiments of the methods described herein may be incorporated into chemical vapor deposition (CVD) and/or atomic layer deposition (ALD) processes, using hardware typically associated with such processes. The method may be used to selectively reduce a film deposition precursor that is adsorbed onto partially processed integrated circuit wafer to form metal layers thereon, without impacting the underlying layers in the partially processed wafer.

In one or more embodiments, the metal layers include tantalum, titanium and/or cobalt. The tantalum and/or titanium metal layers are typically deposited via ALD techniques using metal precursors such as metal halides, including tantalum fluoride ($TaF_5$), tantalum chloride ($TaCl_5$), titanium fluoride ($TiF_4$), and titanium chloride ($TiCl_4$). In use, a metal halide precursor flowed into a chamber and absorbed onto the surface of substrate, the deposited metal precursor layer is then treated with hydrogen plasma, which reduces the metal halide precursor to pure metal. The resulting byproducts of the reduction, i.e., HCl and/or HF, are volatile at processing conditions and are pumped out of the chamber. Cobalt metal layers are typically deposited via CVD techniques using a cobalt-metallo-organic precursor, such as, for example dicobalt hexacarbonyl tertiary butyl acetylene. In such embodiments, the hydrogen plasma is used to remove carbon or other organic components from the deposited layer.

In a first aspect of the present invention, the method may include placing a substrate on a substrate support in a chamber of a reactor, depositing a metal precursor on the substrate and reducing the metal precursor to form a metal layer. Reducing the metal precursor to form a metal layer may be accomplished by various methods including exposing the metal layer to a hydrogen plasma generated by alternating low and high frequencies, exposing the metal layer to a hydrogen plasma having a dual low and high frequency, and/or exposing the metal layer to a hydrogen plasma having a high frequency.

Figure 3:
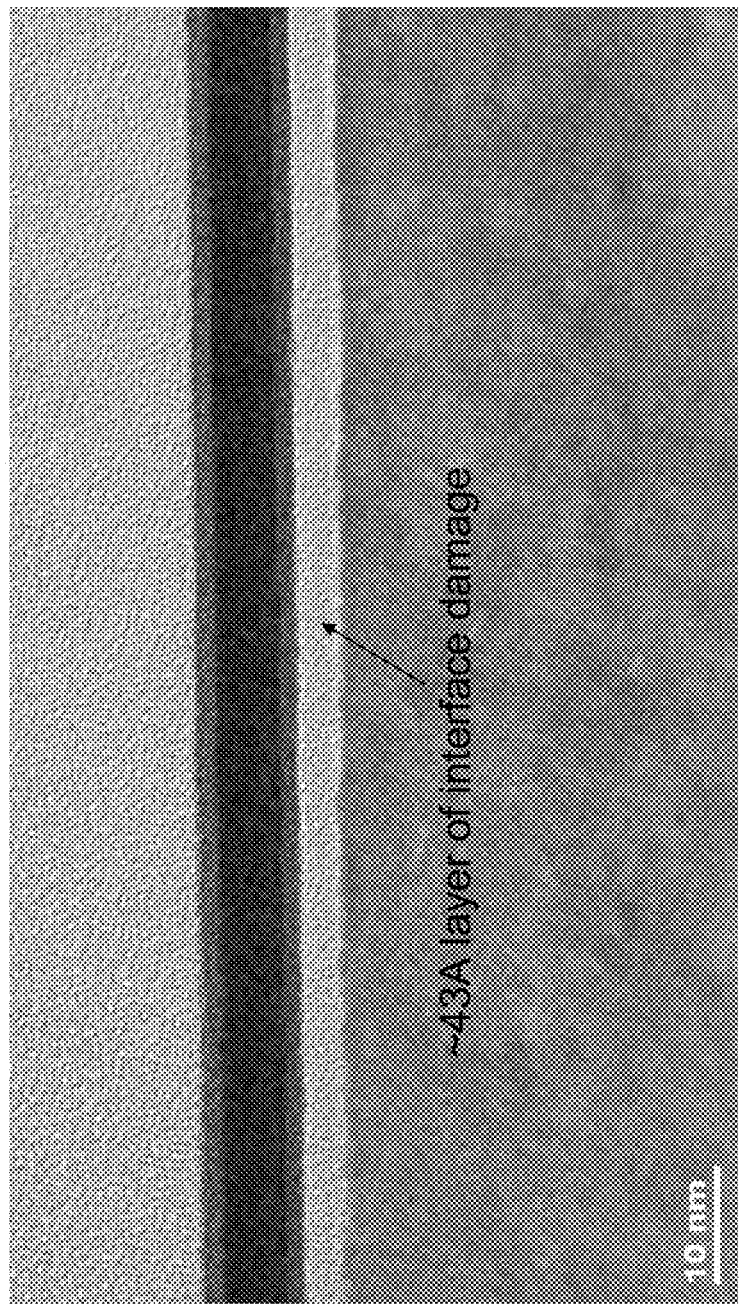
FIG. 3 is microscope image of a partial cross-section view of a semiconductor device after hydrogen plasma treatment according to the prior art.

Use of a low frequency-generated hydrogen plasma, for example, a hydrogen plasma generated by a frequency of less than 15 MHz, for example, about 13.56 MHz, provides smoother wall coverage of the metal layer or improved step coverage. As used herein, step coverage refers to coverage on the sidewalls of gate dielectric layers. However, as shown in FIG. 3, use of a hydrogen plasma generated by a frequency of about 13.56 MHz can cause damage to the underlying Si layer. Specifically, FIG. 3 illustrates a tantalum metal layer disposed on a gate dielectric layer, which is disposed on a Si layer. To form the tantalum metal layer, by alternating a tantalum metal precursor layer deposition hydrogen plasma treatment. Two hundred deposition/reduction cycles were performed, with each cycle lasting 10 seconds, yielding a deposition rate of 0.6/cycle. The hydrogen plasma reduction was performed at a power of 400 W using a frequency of 13.56 MHz. As shown in FIG. 3, use of this low frequency-generated hydrogen plasma caused approximately 43 Å of interface damage that is typically located between the native oxide layer and a gate dielectric layer, i.e., $HfO_2$ layer, deposited thereon. As used herein, "about 13.56 MHz" frequency refers to a frequency less than 15 MHz, for example in the range of about 10 MHz to less than 15 MHz. "About 40 MHz" refers to a frequency in the range of 30 MHz to 50 MHz.

The damage caused to the gate dielectric layer and the Si layer interface was a previously unknown and unexpected problem due to the widespread understanding that hydrogen radicals in hydrogen plasma were too light or did not weigh enough to cause such damage. Accordingly, the damage caused by conventional hydrogen plasma treatment processes was unknown and unexpected, and no new processes have been available to address this unknown and unexpected problem.

Figure 4:
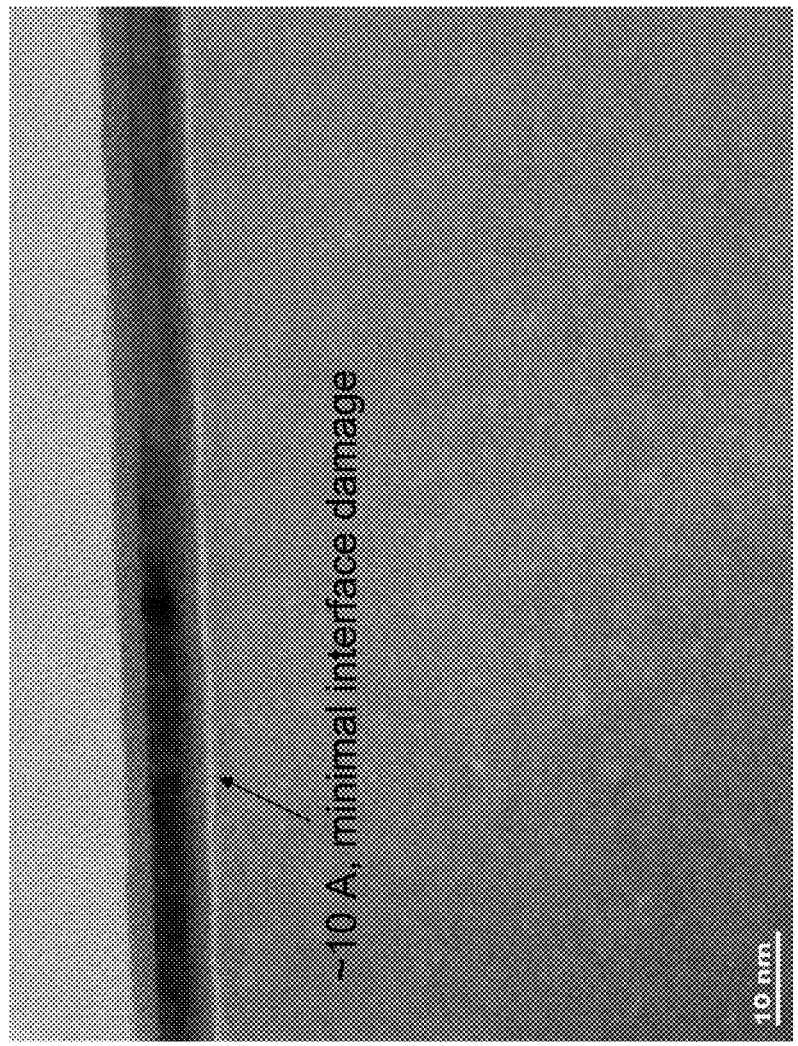
FIG. 4 is a microscope image of a partial cross-section view of a semiconductor device after hydrogen treatment according to one or more embodiments of the present invention.

As shown in FIG. 4, use of a high frequency-generated hydrogen plasma, for example, about 40 MHz frequency-generated hydrogen plasma, to reduce a metal precursor layer disposed on a gate dielectric layer, which is disposed on a Si layer, under the same parameters as the low frequency plasma treatment of FIG. 3 results in no plasma damage. FIG. 4 specifically illustrates a 10 Å thick native SiO or native oxide on the top surface that is typically present and was not removed before $HfO_2$ deposition. Accordingly, FIG. 4 shows a typical and desirable configuration with the appropriate layers having appropriate or acceptable thicknesses, i.e., 10 Å. Evidence that such layers have an increased thickness or a thickness that is greater than 10 Å or 20 Å indicates damage to the interface between the native oxide layer and the gate dielectric layer, as shown in FIG. 3.

Specifically, in FIG. 4 the same quality of film is obtained by blanket wafer deposition over the film shown in FIG. 3, in which blanket wafer deposition was performed 200 deposition/reduction cycles were performed in which the hydrogen reduction was performed at a power of 400 W using a frequency of 13.56 MHz. In FIG. 4, the film was formed using blanket wafer deposition performed under the same conditions as FIG. 3, except hydrogen reduction was performed at a power of 400 W using a frequency of 40 MHz.

Figure 5:
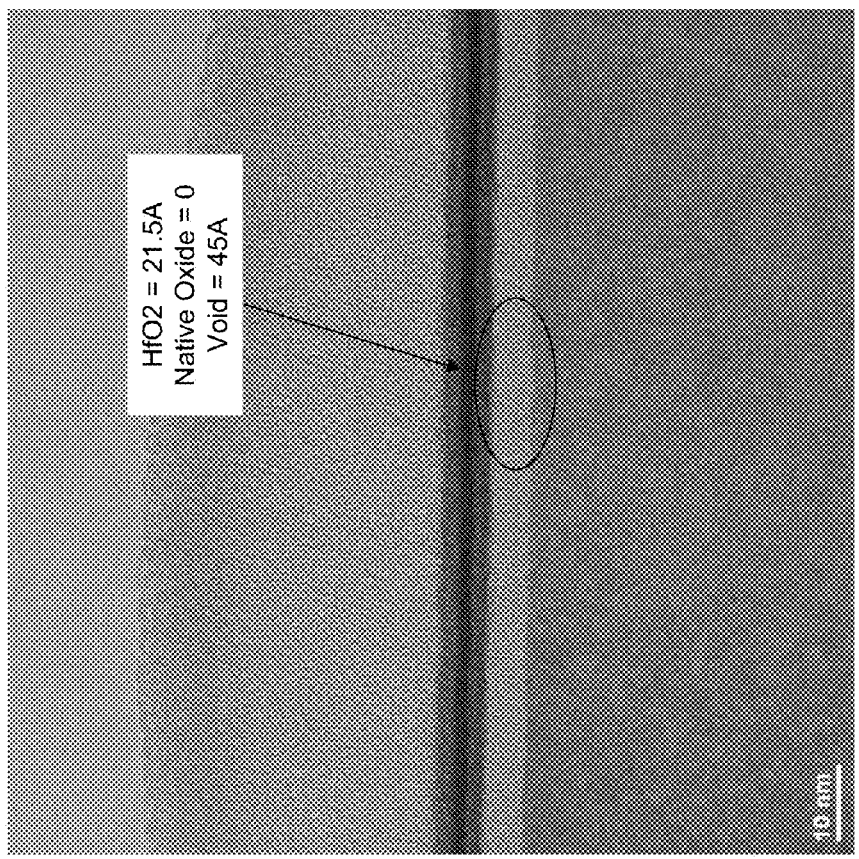
FIG. 5 is a microscope image of a partial cross-section view of a semiconductor device after hydrogen plasma treatment according to the prior art.
Figure 6:
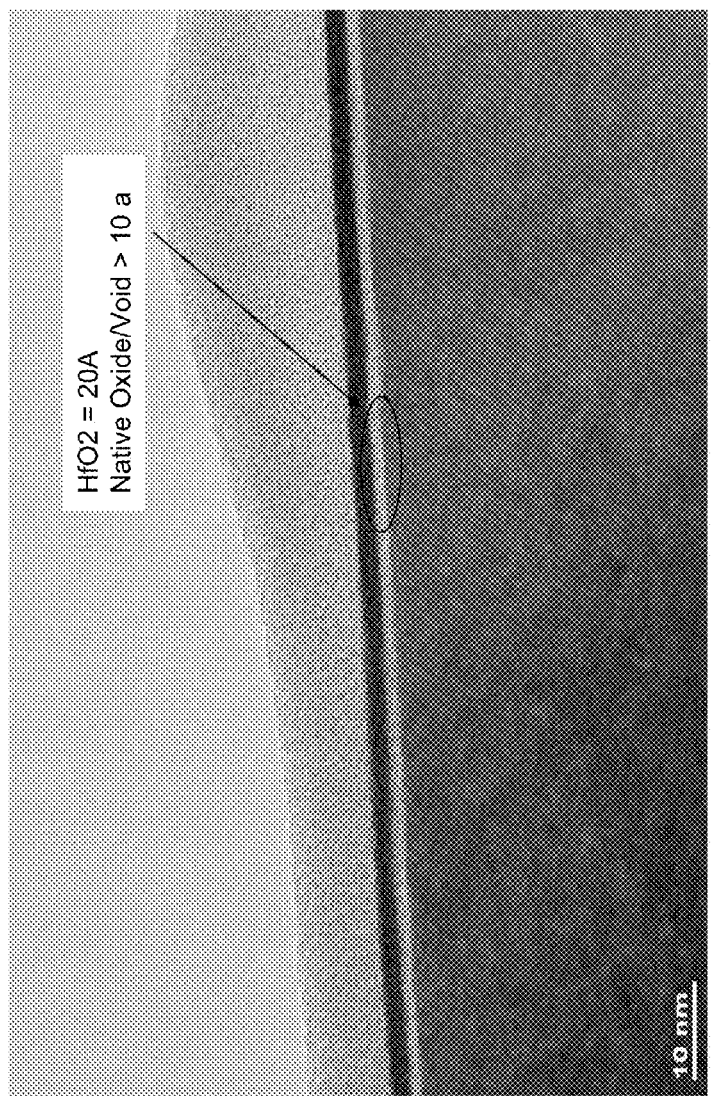
FIG. 6 is a microscope image of a partial cross-section view of a semiconductor device after hydrogen treatment according to one or more embodiments of the present invention.

FIGS. 5 and 6 show the potential damage caused to a dielectric layer and Si layer interface by mere exposure to low frequency-generated hydrogen plasma. FIG. 5 illustrates a wafer having a Si layer, a $HfO_2$ dielectric layer having a thickness of 21.5 Å disposed thereon and a metal layer disposed on the $HfO_2$ layer. The metal layer was formed by alternating the deposition of a metal precursor layer and reducing the metal precursor layer by exposing it to a hydrogen plasma. To form the metal layer shown in FIG. 5, two hundred deposition/reduction cycles were performed with each cycle lasting 10 seconds, yielding a deposition rate of 0.65 Å/cycle. The hydrogen reduction was performed at a power of 400 W using a frequency of 13.56 MHz at a chamber pressure of 5 Torr, wherein the hydrogen plasma had a flow rate of 4000 sccm As shown in FIG. 5, a native oxide/void having a thickness of about 45 Å results between the Si layer and the dielectric layer.

FIG. 6 illustrates a wafer having a Si layer and a HfO$_2$ dielectric layer having a thickness of 20 Å disposed thereon and a metal layer disposed on the HfO$_2$ layer. The metal layer was formed by alternating the deposition of a metal precursor layer and reducing the metal precursor layer by exposing it to a hydrogen plasma. To form the metal layer shown in FIG. 6, two hundred deposition/reduction cycles were performed with each cycle lasting 10 seconds, yielding a deposition rate of 0.65 Å /cycle. The hydrogen reduction was performed at a power of 400 W using a frequency of 40 MHz at a chamber pressure of 5 Torr, wherein the hydrogen plasma had a flow rate of 4000 sccm. As shown in FIG. 6, the plasma treatment results in a native oxide layer having a thickness of less than about 10 Å between the Si layer and the dielectric layer. The layers and the thickness of the layers shown in FIG. 6 are typical and desirable.

Typical reaction chambers that may be used to deposit pure metal layers on a substrate as described herein may include a plasma reactor for supplying plasma to the chamber of the reactor. The reactor 11 shown in FIG. 7 includes a vacuum chamber 10 having a cylindrical side wall 12 and a ceiling 14 which may be either dome-shaped (as shown in the drawing), flat, or another geometry. A first plasma source power applicator comprises a coil antenna 16 disposed over the ceiling 14 and coupled through a first impedance match network 21 to a first frequency power source. The power source comprises an RF power generator 25 and a gate 23 at the output of the generator 25. In the embodiment shown in FIG. 7, a second plasma source power applicator may be included and may comprise a coil antenna 17 disposed over the ceiling and coupled through a second impedance match network 18 to a second frequency power source. The second frequency power source consists of an RF power generator 20 and a gate 22 at the output of the generator 20.

It will be understood that other apparatus can be used to generate plasma using more than one frequency of different frequencies. For example, a single power source can be used, and an appropriate device to split power to the power applicators such as an adjustable capacitor.

Figure 7:
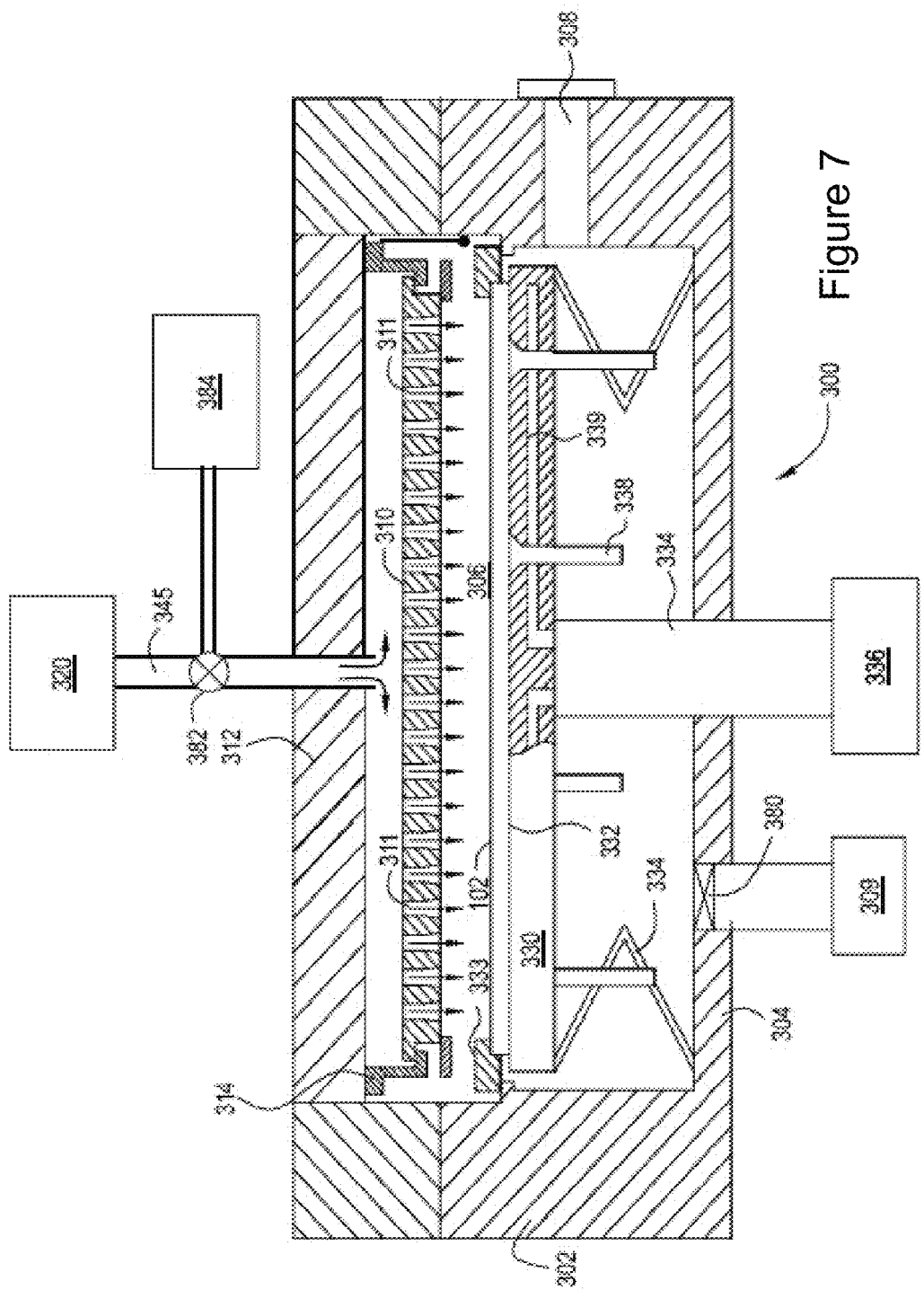
FIG. 7 illustrates an exemplary processing chamber for use with one or more embodiments of the present invention.

The reactor 11 may also includes a substrate support pedestal 24, which may be an electrostatic chuck or other suitable substrate support, for holding a semiconductor substrate 26 such as a 200 mm or 300 mm semiconductor wafer or the like. An optional heating apparatus such as a heater 34 beneath the top surface of the substrate support pedestal 24. The heater 34 may be a single or multiple zone heater, such as a dual radial zone heater having radial inner and outer heating elements 34a and 34b, as depicted in FIG. 7.

In addition, the reactor includes a gas injection system 28 and a vacuum pump 30 coupled to the interior of the chamber 10. The gas injection system 28 is supplied by one or more process gas sources such as, for example, an hydrogen container 32, an oxygen container 62 or a noble gas container 70. Other process gas sources may be included, such as a water vapor source and an inert gas source (not shown). Flow control valves 66, 64 and 68 are coupled to the oxygen container 32, the hydrogen container 62 and the noble gas container 70, respectively, and may be utilized to selectively provide process gases or process gas mixtures to the interior of the chamber 10 during processing. Other gas sources (not shown) for providing additional gases such as nitrogen, gaseous mixtures, or the like may also be provided. The pressure inside the chamber 10 may be controlled by a throttle valve 38 of the vacuum pump 30.

Hydrogen plasma is generated in an ion generation region 39 corresponding to a volume under the ceiling 14 surrounded by the coil antennas 16 and 17. As the plasma is formed in an upper region of the chamber 10 at a distance from the substrate 26, the plasma is referred to as a quasi-remote plasma (e.g., the plasma has benefits of remote plasma formation, but is formed within the same chamber 10 as the substrate 26.

In one or more embodiments, it was found that utilizing a dual frequency plasma treatment process provides the benefits of smoother wall coverage and preventing damage to the underlying layers in the partially processed wafer. As used herein, the term "dual frequency" refers to a plasma treatment process that includes alternating the high frequency-generated hydrogen plasma with a low frequency-generated hydrogen plasma or simultaneously using low frequency-generated and high frequency-generated hydrogen plasma.

In one or more embodiments, the metal precursor layer may be exposed to dual frequency hydrogen plasma generated by alternating low and high frequencies. As used herein, "low frequency" refers to a frequency of less than about 15 MHz, for example, in the range of about 1 MHz and 15 MHz, and "high frequency" refers to a frequency greater than about 20 MHZ, for example, in the range of 20 MHz to 60 MHz, and more specifically in the range of about 25 MHZ to 50 MHz. The low frequency may include a frequency of about 13.56 MHz and the high frequency may include a frequency of about 40 MHz. In such embodiments, the method may include introducing a hydrogen gas into the chamber, supplying power to a power source operating at about 13.56 MHz frequency to generate a hydrogen plasma within a chamber for a first cycle and then supplying power to a power source operating at a about 40 MHz frequency to generate a hydrogen plasma within the chamber for a second cycle. The first and second cycles may be repeated with the first cycle occurring before the second cycle. In one or more embodiments, the same power source may be utilized or separate power sources may be utilized. In a more specific embodiment, the first cycle of supplying power to a power source operating at about 13.56 MHz frequency occurs after the second cycle and may be repeated.

In one or more embodiments, the method includes cyclical deposition and reduction of metal precursor layers. In one or more specific embodiments, the reduction step after each deposition step may include exposing the metal precursor layer to about 40 MHz frequency-generated hydrogen plasma for several cycles until an initial thickness of the resulting metal layer is formed. Thereafter, subsequent reduction steps after each subsequent deposition step may be performed using about 13.56 MHz frequency-generated hydrogen plasma.

In one or more embodiments, the method includes exposing the metal precursor layer to a hydrogen plasma having a dual low and high frequency includes introducing a hydrogen gas into the chamber, supplying power to a power source operating at a frequency of about 13.56 MHz to generate a hydrogen plasma within a chamber and simultaneously supplying power to a power source operating at a frequency of about 40 MHz to generate a hydrogen plasma within the chamber. In such embodiments, the power source operating at 13.56 MHz frequency is separate from the power source operating at about 40 MHz frequency.

In one or more embodiments, use of dual frequency plasma treatment as described above provides reduction or elimination in plasma damage while preventing any negative changes in resistivity. Moreover, the use of dual frequency-generated plasma enables pure metal deposition in other applications such as plasma enhanced atomic layer deposition (PEALD), used in the formation of metal gate applications, or other applications in which the underlying layers should not be exposed to plasma species.

Figure 8A:
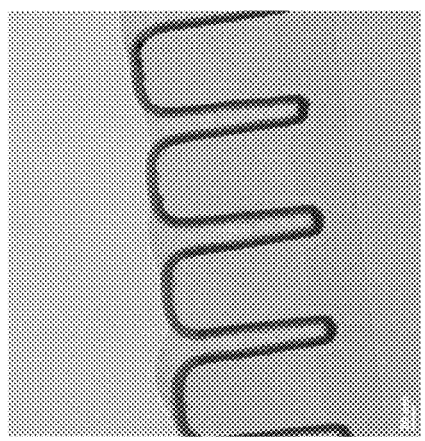
FIG. 8A is a microscope image of a partial cross-section view of a semiconductor device after hydrogen plasma treatment according to the prior art.
Figure 8B:
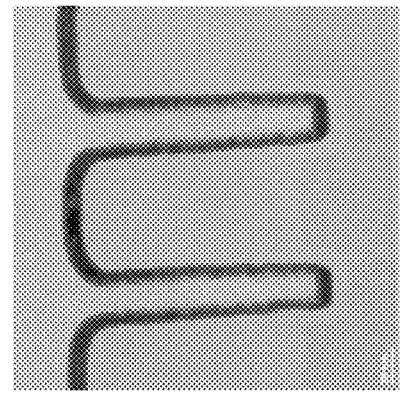
FIG. 8B is a microscope image of a partial cross-section view of a semiconductor device after hydrogen plasma treatment according to one or more embodiments of the present invention.
Figure 8C:
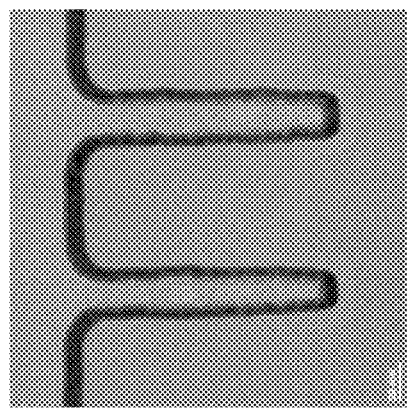
FIG. 8C is a microscope image of a partial cross-section view of a semiconductor device after hydrogen plasma treatment according to one or more embodiments of the present invention.

FIGS. 8A, 8B and 8C illustrate tantalum metal layers formed from the treatment of tantalum metal precursor layers deposited via an ALD (atomic layer deposition) process with hydrogen plasma generated at frequencies of about 13.56 MHz and about 40 MHz. The tantalum metal layers of FIGS. 8A, 8B and 8C were formed using the following process recipe:
1) a $TaF_5$ gas was flowed into a chamber containing a substrate for 5 seconds;
2) the chamber was purged for 5 seconds;
3) the chamber was vacuum pumped for 10 seconds;
4) the chamber and the substrate were allowed to stabilize for 5 seconds;
5) the substrate was treated with a hydrogen plasma for 10 seconds; and
6) the chamber was purged for 5 seconds.

In FIG. 8A, the tantalum metal precursor layer was treated with 13.56 MHz frequency-generated hydrogen plasma using a chamber pressure of 3.5 torr. As shown in FIG. 8A, the tantalum metal layer that resulted had a step coverage of about 75%.

In FIG. 8B, the tantalum metal precursor layer was treated with about 40 MHz frequency-generated hydrogen plasma using a chamber pressure of 3.5 torr. In FIG. 8B, the tantalum metal layer that resulted had a step coverage of about 60%.

In FIG. 8C, the tantalum metal precursor layer was treated with about 40 MHz frequency-generated hydrogen plasma using a chamber pressure of 1 torr. In FIG. 5c, the tantalum metal layer that resulted also had a step coverage of about 60%.

In ALD or PEALD processes for depositing a tantalum metal layer, under the same processing conditions, treatment of a tantalum metal precursor layer with about 13.56 MHz frequency-generated results in a metal layer with better step coverage and possibly less roughness. However, such treatment has been found to cause damage to the underlying layers, as illustrated in FIGS. 2A, 3 and 5. In one or more embodiments, to address these issues, a tantalum metal layer may be formed by using deposition/reduction cycles to form a desired thickness of a tantalum metal layer. In one or more embodiments, the deposition/reduction cycles may include depositing some of the tantalum metal precursor layer on the substrate and treating it with a dual-frequency plasma to obtain a metal film without causing damage to the underlying film as achieved through the use of about 40 MHz frequency-generated hydrogen plasma, with improved roughness and step coverage that is achieved through the use of about 13.56 MHz frequency. The deposition/reduction cycle is repeated until a desired thickness of tantalum metal layer is achieved. This cyclical process may also be used to deposit other types of metal layers.

In one or more embodiments, dual frequency generated hydrogen plasma may also improve processing. For example, during tantalum metal deposition ALD processes, tantalum film may be deposited on the showerhead and/or the process kit, which are typically at a lower temperature than the substrate being processed. This deposited tantalum film may be very loose or may not stick to the surfaces of the processing chamber when a hydrogen plasma treatment using about 40 MHz frequency-generated hydrogen plasma is utilized and may fall onto a substrate processing or subsequent processing. The stickiness or the ability of the tantalum film to adhere to these surfaces is found to be improved with when a hydrogen plasma treatment using about 13.56 MHz frequency-generated hydrogen plasma is utilized. The difference in the stickiness of the resulting tantalum film deposited on the showerhead and other components of the chamber was determined by applying a piece of tape with an adhesive surface to the showerhead surface of a chamber used to perform hydrogen plasma treatment using about 40 MHz frequency-generated hydrogen plasma after 50 deposition processes. The tape utilized is available under the trademark Scotch® from 3M of Minneapolis, Minn. After application, the tape was then pulled off. Tantalum film was visibly seen to peel off from the showerhead. When the same tape was applied to the showerhead surface of a chamber used to perform hydrogen plasma treatment using about 13.56 MHz frequency-generated hydrogen plasma after 50 deposition processes, and pulled off, the tantalum film was not visible on the tape.

Accordingly, in one or more embodiments, to improve particle performance of the PEALD chamber used to deposit tantalum metal layers, hydrogen plasma treatment using a dual frequency-generated hydrogen plasma may be utilized to prevent damage to the underlying layer, while improving particle performance of the chamber. In one or more specific embodiments, hydrogen plasma treatment using about 13.56 MHz frequency-generated hydrogen plasma may be performed at the end of the deposition cycle at the end of a deposition/reduction cycle using about 40 MHz frequency-generated hydrogen plasma and/or when a substrate is not present in the chamber to improve adhesion of tantalum film deposited on the process kit and lid parts. Such low frequency plasma treatment may also be used after treatment of a metal precursor layer with only a high frequency-generated hydrogen plasma.

In one or more embodiments, the method includes exposing the metal precursor layer to a hydrogen plasma generated by a frequency of about 40 MHz. Such embodiments exclude the use of a low frequency plasma. In one variant, the method includes introducing a hydrogen gas into the chamber and supplying power to a power source operating at a frequency of about 40 MHz to generate a hydrogen plasma generated by a frequency of about 40 MHz within the chamber.

In one or more embodiments, the power utilized to generate the 40 MHz frequency hydrogen plasma may be in the range from about 200 W to about 2000 W. In one variant, the power utilized to generate the 40 MHz frequency hydrogen plasma may be about 800 W. The recited power may also be utilized in processes in which hydrogen plasma treatment is performed using only about 40 MHz frequency-generated hydrogen plasma, a dual frequency plasma, or about 13.56 MHz frequency-generated plasma treatment used to improve adhesion of the metal layer deposited on showerheads and the processing kit.

Typically processing conditions include utilizing a heater that has a temperature range from about 100° C. to about 550° C. To form the plasma described herein, a hydrogen ($H_2$) reactant is flowed into the chamber. Other reactants such as $NH_3$, Ar, $N_2$, etc. known in the art may also be flowed into the chamber with the hydrogen reactant or separately.

One or more methods described herein may be used to form metal layers on a gate electrode, which includes a pair of sidewalls, which may be disposed on an underlying Si layer. In such embodiments, the power supplied at a frequency of about 40 MHz provides sufficient energy to cover the sidewalls, while preventing damage to the underlying substrate or Si layers. In other words, the hydrogen plasma generated by a frequency of about 40 MHz has an angular distribution of ions and higher ion energies to result in smoother sidewall coverage without the undesirable effects of low frequency hydrogen plasma.

In thin film applications where the metal layer have a thickness of 10-20 Å, the use of high frequency hydrogen plasma allows more or further hydrogen plasma treatment to be performed without the risk of damage to the underlying Si layer. In addition, the increased tolerance of metal layers to high frequency hydrogen plasma treatment opens the possibility of using methods in which a metal layer is formed using a cyclical process which includes alternating the deposition of a thin layer of metal layer followed by hydrogen plasma treatment and repeating the cycle until a metal layer having a desired thickness is formed. Typical film thickness may be in the range from about 10 Å to 100 Å and, therefore such cycles typically number about 10 or less than 10. In use, such methods can potentially include up to 200 cycles of deposition and hydrogen treatment. The hydrogen plasma treatment methods described herein do not cause damage to the underlying Si layer, even after exaggerated 200 deposition and plasma treatment cycles, whereas it had been seen that treatment with 13.56 MHz frequency hydrogen plasma caused damage to the underlying Si layer after only 100 cycles of deposition and plasma treatment.

In one or more specific embodiments, exposing the metal precursor layer to a hydrogen plasma generated by a frequency of about 40 MHz is particularly useful in the deposition of cobalt metal layers using CVD. In such embodiments, the resulting metal layer has the same properties, including film resistivity, as cobalt metal layers formed from the treatment of cobalt metal precursor layers with about 13.56 MHz frequency-generated hydrogen plasma without causing the damage to the layers underlying the cobalt metal layer that is found after treatment with about 13.56 MHz frequency-generated hydrogen plasma.

The present invention will be further understood by reference to the following non-limiting examples; however, the scope of the claims is not to be limited thereby.

EXAMPLES

Example 1

Comparative Sample A and Inventive Sample B were prepared to compare the reduction in resistivity in substrates with metal layers disposed thereon that are treated with a hydrogen plasma generated by about 13.56 MHz frequency power source and those treated with a hydrogen plasma generated by about 40 MHz frequency power source. The roughness of the resulting metal layers of both samples and the damage, if any, to the layers underlying the metal layers thereon was also compared. In addition, the amount of organic components or other impurities removed from the cobalt metal precursor layers during hydrogen plasma treatment in Comparative Sample A and Inventive Sample B were also compared.

Both Comparative Sample A and Inventive Sample B included identical substrates including a cobalt metal precursor layer deposited via CVD under identical processing conditions. The cobalt metal precursor layers on the substrates of Comparative Sample A and Inventive Sample B were treated with hydrogen plasma to remove the organic component from the cobalt metal precursor layer, leaving a cobalt metal layer. Comparative Sample A was treated ex-situ with a hydrogen plasma generated by about 13.56 MHz frequency power source. Inventive Sample B was treated ex-situ with a hydrogen plasma generated by about 40 MHz frequency power source. Both Comparative Sample A and Inventive Sample B were subjected to the respective hydrogen plasma treatments using the same processing conditions. Specifically, both Comparative sample A and Inventive Sample B the cobalt metal layer were treated with hydrogen plasma performed at a power of 1 kW using the respective frequencies (i.e., 13.56 MHz for Comparative Sample A and 40 MHz for Inventive Sample B) at a chamber pressure of 3.5 Torr for a duration of 60 seconds.

TABLE 1

Comparison of cobalt metal precursor layers treated with 13.56 MHz frequency-generated hydrogen plasma and 40 MHz frequency-generated hydrogen plasma.

| | Comparative Sample A | Inventive Sample B |
|---|---|---|
| Resistivity (μΩ-cm) | 53 | 47 |
| Step coverage | >90% | >90% |
| TEM Roughness (nm) | 1.45 | 1.17 |
| C % by AES | 5 | 3 |
| Duration of plasma treatment | 60 | 60 |
| Damage to underlying layers caused by plasma treatment | Damage visible | No visible damage |
| Crystallinity | | Slightly improved |

As shown above in Table 1, Inventive Sample B exhibited a lower resistivity or, in other words, hydrogen plasma treatment of a cobalt metal layer using about 40 MHz frequency-generated hydrogen plasma yielded a greater reduction in resistivity in the resulting cobalt metal layer and in the removal of more of the carbon organic component than Comparative Sample A. In addition, the resulting cobalt metal layer of Inventive Sample B achieved the same step coverage as Comparative Sample A but had a smoother surface than the resulting cobalt metal layer of Comparative Sample A. In addition, Inventive Sample B did not show any visible damage to the layers underlying the cobalt metal layer, while such damage was visible in Comparative Sample A. In addition, Inventive Sample B exhibited a slightly improved crystallinity by exhibiting a slightly higher XRD peak. The two films of Comparative Sample A and Inventive Sample B are basically comparable. Plasma power used in the two cases is different. In comparative Sample A, a plasma power of 400 W at a frequency of 13.56 MHz was utilized. In Inventive Sample B, a plasma power of 1000 W at a frequency of 40 MHz was utilized. Sample B utilized a higher power because plasma treatment at 40 MHz frequency does not damage the underlying layers of the substrate. Example 1 illustrates that the same kind of positive changes to film properties occur when treated with a hydrogen plasma generated at a frequency of 40 MHz as treatment with a hydrogen plasma generated at a frequency of 13.56 MHz.

Example 2

Inventive Sample C and Comparative Samples D and E were prepared to compare the resistivity in cobalt metal layers that were formed with hydrogen plasma treatment using about 40 MHz frequency-generated hydrogen plasma, with hydrogen plasma treatment using about 13.56 MHz frequency-generated hydrogen plasma and without hydrogen plasma treatment. Samples C, D and E included identical substrates with identical cobalt metal precursor layers deposited thereon. The cobalt metal precursor layers on each of Samples C, D and E had a thickness of 10 nm.

The cobalt metal layer of Inventive Sample C was formed by treating a cobalt metal precursor layer with hydrogen plasma. The hydrogen plasma treatment of Inventive Sample C was performed at a power of 400 W using about 40 MHz frequency-generated hydrogen plasma. The cobalt metal layer of Comparative Sample D was formed by treating a cobalt metal precursor layer identical to the cobalt metal precursor layer of Inventive Sample C with hydrogen plasma. The hydrogen plasma treatment of Comparative Sample D was performed under the same processing conditions as Inventive Sample C, except about 13.56 MHz frequency-generated hydrogen plasma was utilized. Comparative Sample E included a cobalt metal precursor layer that was not treated with a hydrogen plasma.

TABLE 2

Comparison of the resistivity of a cobalt metal layer formed using hydrogen plasma treatment using 13.56 MHz frequency-generated hydrogen plasma and 40 MHz frequency-generated hydrogen plasma and using no hydrogen plasma treatment. The plasma power utilized to generate the hydrogen plasma in Samples C, D and E was the same.

| Sample | Resistivity ($\mu\Omega$-cm) |
|---|---|
| C | 57 |
| D | 58 |
| E | 64 |

As shown in Table 2, the cobalt metal layer of Inventive Sample C exhibited the lowest resistivity. Comparative Sample D showed improved resistivity over Comparative Sample E, which was not treated with a hydrogen plasma.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A method of depositing a metal layer on a semiconductor substrate comprising:
    placing the substrate on a substrate support in a chamber of a reactor;
    depositing a metal precursor layer on the substrate; and
    reducing the metal precursor layer to form a metal layer by exposing the metal precursor layer to a hydrogen plasma comprising a precursor gas including $H_2$ generated by alternating frequencies comprising a low frequency and a high frequency, the low frequency about 13.56 MHz and the high frequency about 40 MHz,
    wherein the deposition of the metal precursor layer and reducing the metal precursor layer occur in repeated cycles until the desired thickness of the metal layer are formed.

2. The method of claim 1, wherein the hydrogen plasma further comprises one or more of Ar, $NH_3$, $N_2$ and He.

3. The method of claim 2, wherein the metal layer deposited on the substrate comprises a metal gate layer and exposing the metal precursor layer to a hydrogen plasma generated by alternating frequencies of about 13.56 MHz and about 40 MHz prevents the hydrogen plasma from penetrating the metal precursor layer and damaging the substrate.

4. The method of claim 2, wherein the substrate comprises a low K material and exposing the metal precursor layer to a hydrogen plasma generated by alternating frequencies of about 13.56 MHz and about 40 MHz prevents the hydrogen plasma from penetrating the metal precursor layer and degrading the low K material.

5. The method of claim 2, wherein the substrate comprises silicon and a metal silicide layer disposed on the silicon creating a silicon/silicide layer interface and exposing the metal precursor layer to a hydrogen plasma generated by alternating frequencies of about 13.56 MHz and about 40 MHz prevents the hydrogen plasma from penetrating the metal precursor layer and damaging the silicon/silicide layer interface.

6. The method of claim 2, wherein exposing the metal precursor layer to a hydrogen plasma generated by alternating frequencies of about 13.56 MHz and about 40 MHz comprises:
    introducing a hydrogen gas into the chamber;
    supplying power to a power source operating at a frequency of about 13.56 MHz to generate a hydrogen plasma within the chamber for a first cycle; and
    supplying power to a power source operating at a frequency of about 40 MHz to generate a hydrogen plasma within the chamber for a second cycle.

7. The method of claim 6, wherein the power supplied to the power source operating at a frequency of about 13.56 MHz is in the range from about 200 W to about 2000 W and the power supplied to the power source operating at a frequency of about 40 MHz is in the range from about 200 W to about 2000 W.

8. The method of claim 1, the deposited metal precursor layers are reduced after deposition by exposing the deposited metal precursor layer to about 40 MHz frequency-generated hydrogen plasma occurs until a metal layer having a thickness in the range from about 0.2 Å to about 3 Å is formed.

9. The method of claim 8, wherein after formation of a metal layer having a thickness in the range from about 0.2 Å to about 3 Å, subsequently deposited metal precursor layers are reduced after deposition by exposing the deposited metal precursor layer to about 13.56 MHz frequency-generated hydrogen plasma occurs until a metal layer having a thickness in the range from about 2 Å to about 70 Å is formed.

10. A method of depositing a metal layer on a semiconductor substrate comprising:
    placing the substrate on a substrate support in a chamber of a reactor;
    depositing a metal precursor layer on the substrate; and
    reducing the metal precursor layer to form a metal layer by exposing the metal precursor layer to a high frequency-generated hydrogen plasma comprising a precursor gas including $H_2$, the hydrogen plasma generated at a frequency of about 40 MHz,
    wherein the metal layer deposited on the substrate comprises a metal gate layer and exposing the metal precursor layer to about 40 MHz frequency-generated hydrogen plasma prevents the hydrogen plasma from penetrating the metal precursor layer and damaging the substrate.

11. The method of claim 10, wherein the hydrogen plasma further comprises one or more of Ar, $NH_3$, $N_2$ and He.

12. The method of claim 11, further comprising removing the substrate from the chamber after deposition of the metal precursor layer and reduction of the metal precursor layer; introducing a second hydrogen gas into the chamber; and supplying power to a power source operating at a frequency of 13.56 MHz to generate a second hydrogen plasma within the chamber.

13. A method of depositing a metal layer on a semiconductor substrate comprising:
    placing the substrate on a substrate support in a chamber of a reactor;
    depositing a metal precursor layer on the substrate; and
    reducing the metal precursor layer to form a metal layer by exposing the metal precursor layer to a high frequency-generated hydrogen plasma generated at a frequency of about 40 MHz,
    wherein (a) the substrate comprises a low-K material and exposing the metal precursor layer to the plasma prevents the hydrogen plasma from penetrating the metal precursor layer and degrading the low-K material; or (b) the substrate comprises silicon and a metal silicide layer disposed on the silicon creating a silicon/silicide layer interface and exposing the metal precursor layer to the plasma prevents the hydrogen plasma from penetrating the metal precursor layer and damaging the silicon/silicide layer interface.

14. The method of claim 13, wherein the hydrogen plasma comprises a precursor gas including $H_2$ or a mixture of $H_2$ and one or more of Ar, $NH_3$, $N_2$ and He.

15. The method of claim 14, wherein exposing the metal precursor layer to a dual frequency-generated hydrogen plasma comprises exposing the metal precursor layer to a high frequency generated plasma.

16. The method of claim 14, wherein exposing the metal precursor layer to a dual frequency-generated hydrogen plasma comprises:
    introducing a hydrogen gas into the chamber;
    supplying power to a power source operating at a low frequency to generate a first hydrogen plasma within the chamber; and
    simultaneously supplying power to a power source operating at a high frequency to generate a second hydrogen plasma within the chamber.

* * * * *